United States Patent
Belveze et al.

(12)

(10) Patent No.: US 6,662,000 B1
(45) Date of Patent: Dec. 9, 2003

(54) SYNCHRONISATION METHOD AND DEVICE FOR A COMMUNICATION RECEIVER

(75) Inventors: Fabrice Jean-André Belveze, Maurepas (FR); Florence Madeleine Chancel, Toulouse (FR)

(73) Assignee: Matra Nortel Communications, Quimper (FR)

( * ) Notice: Subject to any disclaimer, the term of this patent is extended or adjusted under 35 U.S.C. 154(b) by 533 days.

(21) Appl. No.: 09/654,800

(22) Filed: Sep. 5, 2000

(30) Foreign Application Priority Data

Sep. 2, 1909 (FR) ............................................. 99 11013

(51) Int. Cl.[7] .............................................. H04L 27/10

(52) U.S. Cl. ...................................... 455/208; 375/344

(58) Field of Search ............................ 455/182.1, 182.2, 455/183.2, 192.1, 192.2, 208, 161.1, 161.2, 164.1, 164.2; 375/317, 326, 339, 344, 334

(56) References Cited

U.S. PATENT DOCUMENTS 6,016,328 A * 1/2000 Caire et al. ................. 375/272
6,208,695 B1 * 3/2001 Klank et al. ................ 375/260

FOREIGN PATENT DOCUMENTS

| EP | 892 528 | 1/1999 |
|----|---------|--------|
| FR | 2745134 | 8/1997 |

OTHER PUBLICATIONS

Mazzenga, et al.; *Blind Least–Squares Estimation of Carrier Phase, Doppler Shift, and Doppler Rate for M–PSK Burst Transmission*,; IEEE Communications Letters, vol. 2, No. 3, Mar. 1, 1998, pp. 73–75.

Caire, et al.; *A New Symbol Timing and Carrier Frequency Offset Estimation Algorithm for Noncoherent Orthogonal M–CPFSK*; IEEE Transations on Communications, vol. 45, No. 10; Oct. 1, 1997, pp. 1314–1326.

Yoshino, et al; *An Equalizer with Carrier–Aquisition–During–Training Algorithm for Mobile Radio*; Electronics & Communications in Japan; vol. 75, No. 5; May 1, 1992; pp. 98–108.

* cited by examiner

Primary Examiner—Nay Maung
Assistant Examiner—Nick Corsaro
(74) Attorney, Agent, or Firm—Trop, Pruner & Hu, P.C.

(57) ABSTRACT

The method determines a deviation between a modulation frequency, combined with a first baseband signal to form a transmitted signal and a frequency used by the receiver to form a second baseband signal from a received signal, in order to adjust the frequency used by the receiver. Knowing a time segment of the first signal and the time position of a corresponding segment of the second signal, whereby the segments comprise N samples at a sample frequency $F_e$, a frequency transform $Y(f)$, of size N, of the product of the complex conjugate of said segment of the first signal by the corresponding segment of the second signal is calculated, and the frequency deviation $\Delta f$ which makes the frequency transform $Y(f)$ as close as possible to $C.S_c(f-\Delta f)$, is determined, where $$S_c(f) = \frac{1 - \exp(-2j\pi N f / F_e)}{1 - \exp(-2j\pi f / F_e)},$$

and C is a complex coefficient.

20 Claims, 2 Drawing Sheets

SYNCHRONISATION METHOD AND DEVICE FOR A COMMUNICATION RECEIVER

BACKGROUND OF THE INVENTION

The present invention relates to the field of digital communications.

A conventional digital transmission scheme is considered (FIG. 1): the signal received, consisting of a sequence of symbols, originates from a digital modulator 1, then may be deformed by a propagation channel 2.

In many systems the receiver 3 requires two time synchronisation data signals: the "date" of the boundaries between symbols (for the operation of the demodulator), which supplies a synchronisation data signal modulo the duration of a symbol; and a system "clock", whose accuracy is in whole numbers of symbol time, e.g. taking the form of a boundary between "frames" if the transmitted signal has this structure (to take advantage, for example, of the presence of learning sequences at precise instants, and/or to know where to go to subsequently decode the desired data). This clock is indicated by one or more special symbols which act as markers, which the receiver must detect.

Furthermore, the signal received must be correctly situated in the frequency domain, expected by the demodulator 4 of the receiver 3. But since the oscillators of the receiver and the transmitter have a limited accuracy, we may expect a frequency deviation which should be corrected.

The synchronisation component 5 shown in diagram form in FIG. 1 is first called upon by the receiver. It will supply the two data signals (time and frequency). The time data will then be used directly by the demodulator/decoder 4, which will shift its references to obtain both the correct position of the symbols and the useful information. The frequency data will be used by a correction circuit 6 to analogically or digitally correct the frequency position of the signal received. The component 5 implements an algorithm whose object is to estimate the frequency deviation and to retrieve the time structure of the data.

The first important performance criterion of synchronisation is the reliability of the time and frequency data obtained. A second criterion is the cost necessary for obtaining these data (execution time, memory and computing power necessary). There are several categories of synchronisation methods:

- the blind methods, currently called NDA ("Non Data Aided"), which do not require the receiver to know part of the information transmitted (most often thanks to the use of properties of the transmitted signal). The majority of these methods, whether for estimating frequency or time difference, are based on the signal passing through non-linearities, causing lines which can be used for synchronising (see J. B. Anderson et al., "Digital Phase Modulation", Plenum Press, 1986). Moreover, there is a family of analog solutions (PLL, Costas loop, etc, see J. C. Bic et al., "Eléments de communications numériques" ["Elements of Digital Communications"], Volume 1, CNET/ENST Collection, Dunod, 1986). The drawback is that these techniques are specialised by type of modulation, and do not provide a system clock of a higher level than the symbol time;
- for system synchronisation, solutions based on codes (especially convolutional codes) having good autocorrelation properties. Of course, this requires previous frequency and time synchronisation at the symbol level.
- the methods based on a known frame (DA, "Data Aided"), where the receiver knows all or part of a frame, using it to estimate the synchronisation data. In the case of the GSM cellular radio communication system, a specific frequency, i.e. a purely sinusoidal signal, is used for frequency synchronisation, then a dedicated sequence (burst) enables time synchronisation. Another example is described in FR-A-2 745 134.

DA methods have the drawback of lowering the useful throughput, since part of the signal does not carry any information properly speaking. It should, however, be noted that NDA methods are not always applicable depending on the nature of the signal, i.e. that of the transmission encoder. The methods are thus very specific. In particular, there are many methods (see for example: A. D'Andrea et al., "A Digital Approach to Clock Recovery in Generalized Minimum Shift Keying", IEEE Transactions on Vehicular Technology, Vol. 39, No. 3, August 1990; A. D'Andrea et al., "Frequency Detectors for CPM Signals", IEEE Transactions on Communications, Vol. 43, No. 2-3-4, February/March/April 1995) applicable when the encoder is a CPM ("Continuous Phase Modulation") modulator, which do not apply to other types of modulation. Moreover, their execution time performances, measured by the length of time for arriving at reliable synchronisation data, are sometimes poor. DA methods may prove more efficient in terms of execution time, for the same reliability, for a negligible reduction in useful throughput. In addition, they are completely general, and do not depend on the nature of the signal used.

There is therefore a need for a synchronisation process supplying, in a relatively short time, the time and frequency position information of the data. This process must operate for relatively large frequency and/or time differences, within the limit of the bandwidth and for any arrival time of the effective signal. The loss of useful information associated with the synchronisation execution time and/or with the insertion of known data must be negligible in relation to the useful throughput. In addition, it is desirable that this process should not be too costly in computing time and therefore basically use simple operations (addition, multiplication).

The usual method for achieving frequency synchronisation in the case CPM modulations of index k/p (J. B. Anderson et al., "Digital Phase Modulation", Plenum Press, 1986) is a blind method (NDA) consisting of calculating the Fourier transform of the received baseband signal raised to the power p, and detecting lines in the spectrum thus obtained. Frequency lines $\Delta f + i/(2T_s)$ appear in principle in this spectrum, $\Delta f$ being the frequency deviation to be estimated, $T_s$ the duration of a symbol and i an integer. But their detection is sometimes problematic: they can be embedded in the power spectral density of the signal at power p or in the noise picked up by the receiver, and there may be uncertainty over the valid integer i for a detected line. This depends on the characteristics of the CPM used: NDA methods are sometimes unusable.

The object of the present invention is to meet the aforementioned need, especially regarding the aspects of frequency synchronisation. The applications which are especially targeted are digital communication receivers needing a synchronisation component for initiating the decoding of data, for which NDA methods are impossible or not very effective.

SUMMARY OF THE INVENTION

According to the invention, a synchronisation method for a communication receiver is proposed, comprising the steps of evaluating a deviation between a modulation frequency, combined with a first baseband signal to form a signal transmitted on a propagation channel and a frequency used by the receiver to form a second baseband signal from a signal received on the propagation channel, and adjusting the frequency used by the receiver according to the evaluated deviation. Knowing a time segment of the first baseband signal and the time position of a corresponding segment of the second baseband signal, said segments comprising N samples at a sampling frequency $F_e$, a frequency transform $Y(f)$, of size N, of the product of the complex conjugate of said segment of the first baseband signal by the corresponding segment of the second baseband signal is calculated, and said frequency deviation $\Delta f$ is evaluated as being that for which the frequency transform $Y(f)$ is the closest to $C.S_c(f-\Delta f)$, where $S_c(f)$ is the function $$S_c(f) = \frac{1 - \exp(-2j\pi N f / F_e)}{1 - \exp(-2j\pi f / Fe)},$$

and C is a complex coefficient.

In a particular embodiment, the step of evaluating said frequency deviation comprises:
- determining a frequency $f_{max}$ which maximises the quantity $|Y(f)|^2$ among the N points of the frequency transform;
- dividing the interval $[f_{max}-F_e/N, f_{max}+F_e/N]$ into a plurality of sub-intervals;
- a dichotomic search in each of the sub-intervals to identify each frequency $\delta f$ which cancels out the quantity:

$$F(\delta f) = \text{Re}\left\{\langle Y(f), S_c(f - \delta f)\rangle^* \cdot \left\langle Y(f), \frac{\partial S_c(f - \delta f)}{\partial (\delta f)}\right\rangle\right\} \quad (1)$$

where Re(.) and (.)* designate the real and the conjugate parts of a complex number and, for two complex functions of the frequency A(f) and B(f), <A(f),B(f−δf)> designates the inner product:

$$\langle A(f), B(f - \delta f)\rangle = \sum_{i=0}^{N-1} A(f_i) B(f_i - \delta f)^* \quad (2)$$

$f_i$ designating the point of rank i of the frequency transform; and
- selecting the frequency deviation $\Delta f$ as being that of the frequencies $\delta f$ which cancels out the quantity $F(\delta f)$ and for which the cost function:

$$K(\delta f) = \left\|Y(f) \frac{\langle Y(f), S_c(f - \delta f)\rangle \cdot S_c(f \ \delta f)}{\|S_c(f - \delta f)\|^2}\right\| \quad (3)$$

is minimal, $\|.\|$ being the norm associated with said inner product.

Said time segment of the first baseband signal may not be known a priori by the receiver. When the receiver is synchronised in time and frequency and it is desired to update the frequency synchronisation for the possible adjustment of a slight drift of the local oscillator, we can thus use the result of the demodulation and/or decoding as the "time segment of the first baseband signal" to implement the procedure.

Quite often, said time segment of the first baseband signal will, however, be known a priori by the receiver, the method including a time synchronisation phase for obtaining the time position of said segment of the second baseband signal.

Frequency synchronisation then makes use of the signal segments required for time synchronisation, enabling the shortcomings of the NDA methods generally used to be overcome. These segments may remain moderate in size so that the implementation of the method has a moderate bandwidth impact. This size is equal to or greater than the aforementioned number N. Frequency synchronisation is thus dependent upon the success of time synchronisation, which is not too punitive if the probability of successful time synchronisation is high.

In a preferred embodiment, the time segment known a priori includes several consecutive occurrences of a first pattern of $L_c$ samples, and possibly a second pattern longer than the first. The time synchronisation phase includes a modulo $L_c$ estimating stage by maximising the correlation between the second baseband signal and the consecutive occurrences of the first pattern, and a modulo $L_c$ ambiguity removing stage, providing a time synchronisation at the resolution of the samples by maximising the correlation between the second baseband signal and the second pattern.

After thus carrying out a first time synchronisation producing a whole number $n_{est}$ representing a time difference, in number of samples, of the second baseband signal with respect to said time segment of the first baseband signal, the first time synchronisation is refined by adding to the whole number $n_{est}$ the quantity:

$$\Delta\tau - 1 - \lambda \frac{\text{Re}\left\{\sum_{q=0}^{N_c-1}\left[\left(\sum_{k=0}^{L_{Sc}-1} r_{n_{est}+q \cdot L_c+k} \cdot x_k^{c*}\right) \cdot \left(\sum_{k=0}^{L_{Sc}-2} r_{n_{est}+q \cdot L_c+k} \cdot d x_k^{c*}\right)\right]\right\}}{\sum_{q=0}^{N_c-1}\left\|\sum_{k=0}^{L_{Sc}-1} r_{n_{est}+q \cdot L_c+k} \cdot x_k^{c*}\right\|^2} \quad (4)$$

where $\lambda$ is the predetermined normalisation factor:

$$\lambda = \frac{\left(\sum_{k=0}^{L_{Sc}-1} |x_k^c|^2\right)^2}{\left(\sum_{k=0}^{L_{Sc}-1} |x_k^c|^2\right) \cdot \left(\sum_{k=0}^{L_{Sc}-1} |d x_k^c|^2\right) - \left[\text{Im}\left(\sum_{k=0}^{L_{Sc}-1} x_k^c \cdot d x_k^{c*}\right)\right]^2} \quad (5)$$

$N_c$ is the number of consecutive occurrences of the first pattern, $L_{Sc}$ is the number of samples of the repetitive sequence formed by the consecutive occurrences of the first pattern in said time segment of the first baseband signal, $r_{n_{est}}+q \cdot L_{c+k}$ is the sample of rank $n_{est}+q \cdot L_c+k$ of the second baseband signal, $x_k^c$ is the sample of rank k of said repetitive sequence, $dx_k^c$ is the sample of rank k of a sequence formed by the time derivative of said repetitive sequence, and Im(.) designates the imaginary part of a complex number.

Another aspect of the present invention relates to a synchronisation device for a communication receiver, comprising means of analysing a received signal, arranged for implementing a method such as that defined above.

DESCRIPTION OF PREFERRED EMBODIMENTS

The invention is illustrated below in a particular application to radio communications with mobile terminals. It should be understood that this example in no way limits the field of application of the invention.

In this particular example, the information transmitted is split into 20 ms frames. The digital modulator shown in FIG. 2 operates according to a quaternary CPM type modulation, with a 1/3 modulation index, whose phase pulse $$\left( q(t) = \int_{-\infty}^{t} g(u)\,du/2 \cdot \int_{-\infty}^{+\infty} g(u)\,du \right)$$

is, for example, defined by $$g(t) = -\frac{\sin(\lambda_1 \pi (t - LT_s/2))}{\lambda_1 \pi (t - LT_s/2)} \times \frac{\sin(\lambda_2 \pi (t - LT_s/2))}{\lambda_2 \pi (t - LT_s/2)},$$

where $\lambda_1 = 0.5$, $\lambda_2 = 0.77$ and $L = 4$, $T_s$ designating the duration of a symbol. The symbols transmitted, represented by $\alpha_i$, are in the set $\{-3, -1, +1, +3\}$. They are transmitted at the rate of $1/T_s = 8000$ symbols per second. The complex baseband signal is written in the usual form as $x(t) = \exp[j\phi(t)]$, with $$\varphi(t) = \frac{2\pi}{3} \sum_{i=0}^{[t/T_s]} \alpha_i \cdot q(t - iT_s).$$

This CPM modulation can be described by a trellis comprising 3 phase states (0, $2\pi/3$, $-2\pi/3$ at even symbol-times, and $\pi$, $-\pi/3$, $\pi/3$ at odd symbol-times) and 4 transitions per state (corresponding to the four possible symbols).

Figure 1:
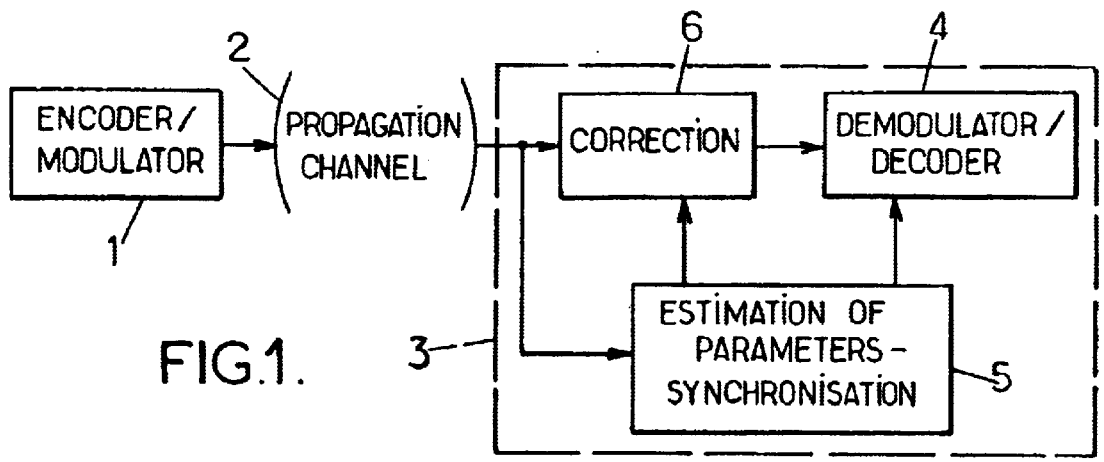
FIG. 1, previously discussed, is a block diagram of a digital transmission chain.
Figure 2:
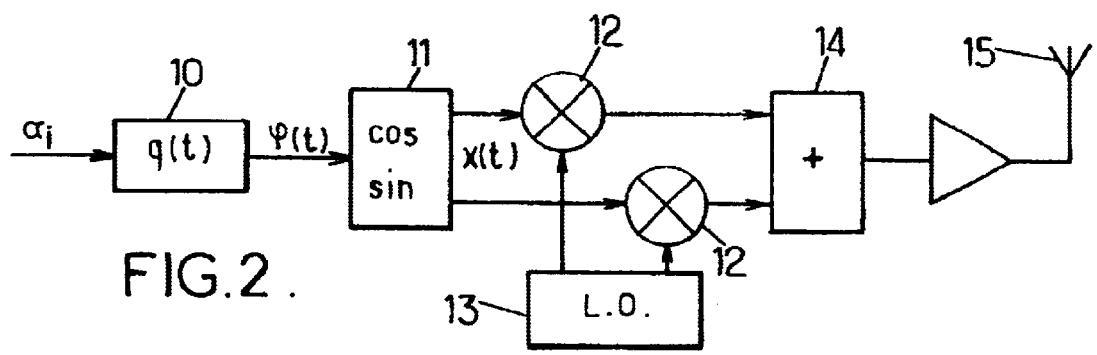
FIG. 2 shows an exemplary embodiment of a modulator of a digital radio transmitter.

In the embodiment shown in FIG. 2, the filter 10 applies the phase pulse q(t) to the symbol train $\alpha_i$. The cosine and sine of the resultant phase $\phi(t)$, respectively forming the real and imaginary parts of the baseband signal x(t), are supplied by a module 11, sampled at a frequency of $F_e = 16$ KHz (two complex samples per symbol-time).

Two multipliers 12 respectively modulate two quadrature radio waves of frequency $f_0$, delivered by a local oscillator 13, by the real and imaginary parts of the baseband signal x(t) converted into analog. The two modulated waves are summed in 14 to form the radio signal amplified and transmitted by the antenna 15.

Figure 3:
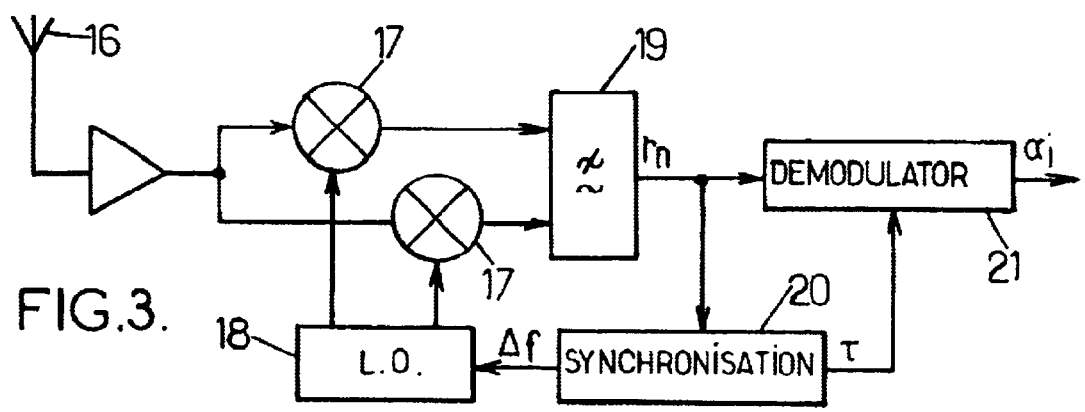
FIG. 3 is a block diagram of an associated receiver, with a synchronisation module for implementing the invention.

The associated propagation channel 2 is a fading channel, called a Rayleigh channel. The demodulator used by the receiver in FIG. 3 may be based on a standard Viterbi algorithm functioning according to the aforementioned trellis (see G. D. Forney Jr., "The Viterbi Algorithm", Proc. of the IEEE, Vol. 61, No. 3, March 1973, pages 268–278). This demodulator needs to be synchronised in time and frequency.

The radio signal received by the antenna 16 and amplified is submitted to two multipliers 17 receiving two quadrature waves of frequency $f_0 + \Delta f$, delivered by a local oscillator 18. The outputs of the multipliers 17 form a complex signal processed by a low-pass filter 19, whose cut-off frequency corresponds to the bandwidth of the signal, e.g. 6 kHz. The complex baseband signal r(t) available at the output of the filter 19 is sampled at the frequency $F_e$ and digitised, downstream or upstream of the filter 19 according to whether this is in analog or digital form. This sampled baseband signal is denoted by $r_n$, n being the sample index. The digital signal $r_n$ is sent to a synchronisation unit 20 and to the demodulator 21 which will produce the estimates $\alpha_i$ of the transmitted symbols.

The frequency difference $\Delta f$ may be due to the inaccuracies of the local oscillator 13 of the transmitter and/or of that 18 of the receiver. On the other hand, there is a time difference $\tau$ between the transmitter and the receiver, due to the unknown propagation time. The baseband signal r(t) obtained in the radio stage of the receiver can be expressed as a function of that x(t) formed by the transmitter:

$$r(t) = C \cdot x(t-\tau) \cdot \exp(2j\pi\Delta f \cdot t) + b(t) \quad (6)$$

where C is a complex coefficient representing the attenuation and phase difference introduced by the propagation channel and b(t) is additive noise.

It is assumed that in the example considered, the time difference $\tau$ is limited in absolute value to 10 ms, and that the frequency difference $\Delta f$ cannot exceed, still in absolute value, 5 kHz.

If the frequency difference $\Delta f$ is excessive (close to its limit value), a significant part of the useful power is lost by reason of the filtering implemented in 19. It is then necessary to carry out a first rough frequency synchronisation enabling this difference to be reduced.

1) Rough Frequency Synchronisation

The receiver cannot cover an infinite frequency band; this is limited by hardware considerations (bandwidth of the components) and can be deliberately selected by filter devices. In particular, in a frequency division multiple access system (FDMA), the frequency channel corresponding to the desired communication is selected. This restriction of the frequency range is effected in the first stage of the receiver (filter 19 in the example shown).

Whether intentional or not, this frequency selection may have adverse consequences for the processing of the signal $r_n$ obtained after this first stage. In fact, the oscillator generating the assumed carrier frequency presents a certain inaccuracy, and the actual carrier frequency of the signal and that used by the receiver cannot be strictly identical. If they are far apart, the filtering around the carrier used by the receiver may then entail the elimination of a part of the useful signal power, which will be lost for subsequent processing.

It should be pointed out, however, that the uncertainties over the frequencies generated by the oscillators 13, 18 are controllable, and that often the maximum possible value is known for the discrepancy between the desired frequency and that actually modulated (5 kHz in the example considered). If this discrepancy is not negligible in view of the bandwidth of the transmitted signal, it can affect the latter irremediably. The first frequency synchronisation proposed is aimed at roughly correcting the initial frequency difference, to bring it down to a much lower value.

This first process consists of a rough estimate of the frequency difference and a correction carried out in the first stage of the receiver, analogically or digitally. This estimate has the advantage of being robust to large frequency differences, even when a large part of the signal power has disappeared due to the filtering of the receiver.

The observed digital signal window $r_n$ of length $L_r$ (n = 0, . . . , $L_r - 1$) is the result of transmitting a signal $x_n$, unknown to the receiver, with added noise and deformed by the propagation channel 2. The following formula provides a first estimate of the frequency difference:

$$\Delta f_1 = \frac{F_e}{2\pi} \left[ \text{Arg}\left(\sum_{n=0}^{L_r-1} r_n^* \cdot r_{n+1}\right) - \text{Arg}\left(\sum_{n=0}^{L_r-1} x_n^* \cdot x_{n+1}\right) \right] \quad (7)$$

there Arg(.) designates the argument of a complex number.

In fact, if the signal received is simply the signal $x_n$ shifted in frequency by $\Delta f$, the formula (7) then gives $\Delta f_1 = \Delta f$. Note that a time difference on $x_n$ has no effect on the estimate $\Delta f_1$. The quantity $$\sum_{n=0}^{L_r-1} x_n^* \cdot x_{n+1}$$

is an approximation of the order 1 autocorrelation of the transmitted signal $x_n$, an approximation which becomes the more accurate as $L_r$ becomes greater. This autocorrelation is a statistical property of the transmitted signal, which can be calculated in advance. The receiver only needs to know the argument of this value.

Furthermore, for many types of signal, in particular CPM modulations as in the example above, the autocorrelation is real and the expression $\Delta f_1$ only depends on the signal received $r_n$ (see A. D'Andrea et al., "Digital Carrier Frequency Estimation For Multilevel CPM Signals", Proc. ICC'95, June 1995). The rough estimate $\Delta f_1$ is then simply:

$$\Delta f_1 = \frac{F_e}{2\pi} \text{Arg}\left(\sum_{n=0}^{L_r-1} r_n^* \cdot r_{n+1}\right) \quad (8)$$

Figure 4:
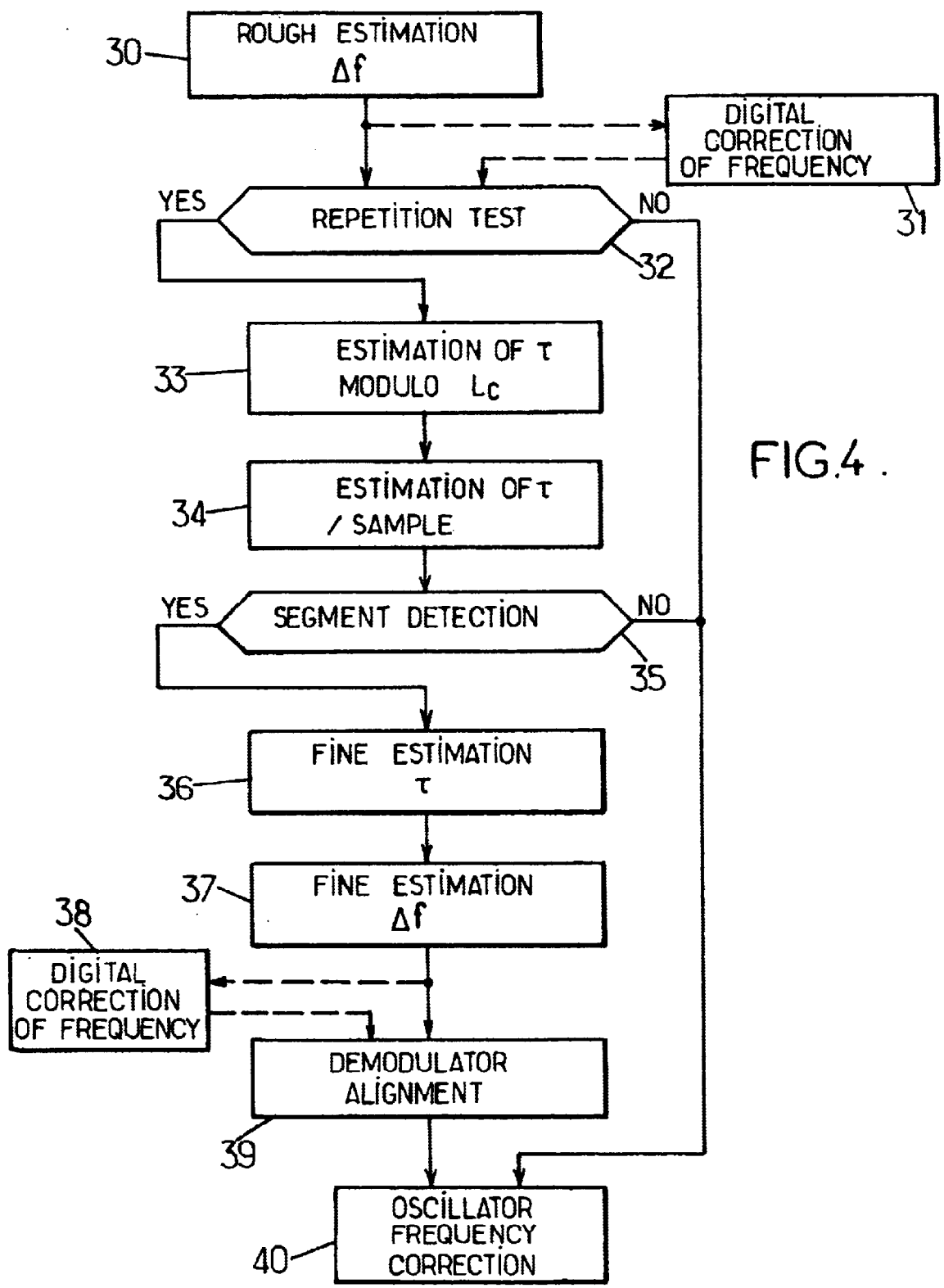
FIG. 4 is a flow chart of a procedure implemented by this synchronisation module.

This estimate is carried out by the synchronisation unit 20 at step 30 in FIG. 4. If a digital frequency correction, namely a multiplication of the unfiltered complex signal by $e^{-2j\pi\Delta f_1}$, is provided upstream of the filter 19, this may be effected on the current signal window in view of the following processing (step 31 in FIG. 4). Otherwise (case shown in FIG. 3), the other synchronisation procedures are carried out without rough frequency correction, and this will be taken into account (where necessary) for the following windows by analog correction of the frequency of the oscillator 18 (step 40).

Simulations have shown that, in the example considered, whatever the propagation conditions, and for initial frequency discrepancies in the [−5, +5] kHz range, the residual difference after this rough correction is never greater than 1500 Hz.

After the rough frequency correction, the residual frequency difference is much lower, which allows the fine time and frequency synchronisation described below.

2) Time Synchronisation

The synchronisation frame chosen in the example is a reference segment of 10 ms inserted in the stream of useful frames, every 500 ms. At each communication initiation, the unit 20 of the receiver launches the synchronisation algorithm which stops once the synchronisation frame has been detected and the processing carried out.

The reference segment used, of a duration of 10 ms, consists in the example considered of $N_c$=3 short, identical, consecutive patterns of 16 symbols each then a long pattern of 32 symbols. The short pattern corresponds for example to the modulation of the succession of 16 symbols: {−3, −3, +1, −1, +1, +1, +1, −3, +1, −3, +3, +1, −3, −3, +3, +3}. This pattern therefore consists of $L_c$=32 predetermined samples. $x_k^c$ denotes the repeated sequence of these samples ($0 \leq k < L_{Sc} = N_c \cdot L_c = 96$).

The long pattern corresponds for example to the modulation of the succession of 32 symbols: {+3, −1, +1, +1, +1, −3, −3, −3, −3, −3, −1, −3, +1, +3, +3, −1, +1, +3, −3, −3, +3, +3, +3, +1, +3, −3, −3, +1, −1, +1, +1, −3}. It therefore consists of $L_l$=64 predetermined samples. $x_k^l$ denotes the sequence of these samples ($0 \leq k < L_l$).

Finally, $x_k$ denotes the succession of $N' = L_{Sc} + L_l = 160$ samples corresponding to the 10 ms reference segment ($x_k = x_k^c$ if $k < L_{Sc}$, $x_k = x_{k-L_{Sc}}^l$ if $L_{Sc} \leq k < N'$).

The time synchronisation algorithm comprises three steps:

a repetition test for testing the presence of a repetitive field corresponding to the succession of short patterns;

a correlation calculation with the short pattern, to estimate the difference $\tau$ modulo $L_c$, followed by a correlation calculation with the long pattern at the positions corresponding to the first estimate modulo $L_c$. This calculation supplies the "system clock" estimate and data on the probability of this estimate;

a fine estimate obtaining a finer time resolution than $T_e = 1/F_e$ for the time difference $\tau$.

2.1) Repetition Test

This test 32 is used to check the nature of the frame being processed. According to the value of the time difference and the memory available in reception, the observed signal may not contain the synchronisation frame. The repetitive structure of the synchronisation frame can then be used to recognise it (the information being theoretically random and therefore not very repetitive), and thus interrupt the algorithm on this first test if it is not conclusive. This enables a reduction in the average amount of calculation to be carried out.

Test 32 consists in evaluating a normalised autocorrelation of the baseband signal $r_n$ relative to a time difference corresponding to the difference $L_c$ between two occurrences of the short pattern $x^c$ in the reference segment.

In order to identify the synchronisation frame, a repetition calculation is performed on $L_c$ samples until a threshold SR is exceeded (e.g. SR$\approx$0.25). The following indicator is thus calculated, for $1 \leq m < L_r/L_c$:

$$rep(m) = \frac{\left|\sum_{k=0}^{L_c-1} r_{k+L_c(m-1)} \cdot r_{k+L_c m}^*\right|^2}{\sum_{k=0}^{L_c-1} |r_{k+L_c(m-1)}|^2 \cdot \sum_{k=0}^{L_c-1} |r_{k+L_c m}|^2} \quad (9)$$

If the threshold SR is never attained by rep(m) over the length of the stored signal (test 32 in FIG. 4), synchronisation fails, and the synchronisation unit 20 simply orders the oscillator 18 to take into account (where necessary) the frequency correction represented by the rough estimate $\Delta f_1$ for the next signal observation window (step 40). If the repetition test is satisfied, the unit 20 searches for the synchronisation segment.

The size of observation window $L_r$ is chosen such that the synchronisation frame can be acquired completely. A preferred solution is a window twice the size of the total synchronisation pattern, or 20 ms where $L_r$=320, whose first half is the same as the second half of the preceding window, and whose second half is the same as the first half of the following window. The repetition test is then used solely for preventing the untimely launch of the algorithm.

2.2.1) Calculating the Estimate of $\tau$ Modulo $L_c$

We first search for the short pattern over the whole length of the observed signal, by progressively shifting n=0, 1, . . . , $L_c-1$ samples, and m times the length of a short pattern (m=0, 1, 2, . . . ) until the end of the accessible memory field is reached. This search is performed thanks to a calculation of correlations between the signal portion considered and the part of the reference segment corresponding to the succession of short patterns. The correlation C(n,m), indexed by n and m with $0 \leq n < L_c$ and $0 \leq m < L_r/L_c$, is calculated at step 33 according to:

$$C(n, m) = \frac{\left| \sum_{k=0}^{L_{Sc}-1} r_{k+n+mL_c} \cdot x_k^{c*} \right|^2}{\sum_{k=0}^{L_{Sc}-1} |r_{k+n+mL_c}|^2 \times E_c} \quad (10)$$

The correlation is normalised by the product of the powers of the received signal and of the signal $$x^c \left( E_c = \sum_{k=0}^{L_{Sc}-1} |x_k^c|^2 \right).$$

This normalisation enables us to overcome the problems of varying received signal dynamics (when there is fading, for example). The synchronisation unit 20 at step 33 determines the position of the correlation matrix maximum thus calculated:

$$(n_{max}, m_{max}) = \underset{(n,m)}{\operatorname{argmax}}[C(n, m)] \quad (11)$$

$n_{max}$ represents a first estimate of the difference modulo $L_c$, and $m_{max}$ the number of the pattern which gives this maximum. At this stage, since only one of the short patterns has been identified, the frame synchronisation is still unknown. The first estimate $n_{max}$ is only accurate to within one sample.

2.2.2) Removing Modulo $L_c$ Ambiguity

We now search for an approximation of the deviation in number of whole samples. The possible deviations are therefore of the form $n_{max}+p.L_c$, where p is a positive integer or zero. We therefore test these positions by calculating, at step 34, the correlations between the long pattern $x^l$ and the signal from these points, for $0 \leq p < L_r/L_c$:

$$C_l(p) = \frac{\left| \sum_{k=0}^{L_1-1} r_{k+n_{max}+pL_c} \cdot m_k^{l*} \right|^2}{\sum_{k=0}^{L_1-1} |r_{k/n_{max}+pL_c}|^2 \times E_1} \quad (12)$$

$$E_1 - \sum_{k=0}^{L_1-1} |x_k^l|^2$$

is the power of the long pattern. The correlations $C_l(p)$ are normalised, between 0 and 1. We denote as pos_I the position corresponding to the maximum of the correlations $C_l(p)$ with the long pattern, which is of the form:

$$\text{pos\_I} = n_{max} + L_c \cdot p_{max}, \text{ where } p_{max} = \underset{p}{\operatorname{argmax}}[C_l(p)]$$

is the index giving the maximum correlation.

At step 34, the synchronisation unit 20 deduces the time difference τ sought, expressed in number of samples, of the position of the long pattern, by eliminating the part corresponding to the short patterns; $n_{est}$=pos_I−$N_c$×$L_c$.

We can add to this estimate an additional piece of information the quality of the synchronisation, which is defined as the maximum $Q=C_l(p_{max})$ of the correlation moduli $C_l(p)$. The quality Q datum relates to the likelihood of the estimate.

This provides a test for judging the reliability of the synchronisation process; if the quality Q does not exceed a given threshold SQ, it may be decided that the synchronisation has failed over the current signal window, and to restart the synchronisation process on another observation. As an example, we may take SQ≈0.35. This test is performed at step 35 in FIG. 4 . If it is not satisfied (Q<SQ), the synchronisation fails, and the synchronisation unit 20 simply orders the oscillator 18 to take into account (where necessary) the frequency correction represented by the rough estimate $\Delta f_1$ for the next signal observation window (step 40). Otherwise, the unit 20 passes on to the next phases of the procedure, in which it refines the synchronisation.

When the time difference τ is limited due to hardware considerations to a low $\tau_{max}$ value in the face of the duration of a symbol, it should be noted that the reference signal may be composed only of a succession of short patterns of duration equal to or greater than $\tau_{max}$. The removal of the ambiguity of the length of the short pattern is then no longer necessary. Moreover, a large number of short patterns can then be used, which enables the accuracy of the fine time synchronisation described below to be improved.

2.3) Fine Time Synchronisation

The preceding value $n_{est}$ is an approximation of the difference τ in number of samples. The accuracy of the estimate may be enhanced thanks to a calculation using the derivative of the reference signal. Here the succession of short patterns is used, since the calculation performed is non-coherent, and the repetition of these patterns noticeably improves the performance of fine estimation.

$dx^c$ denotes the numeric derivative of the short pattern $x^c$, of length $L_{Sc}-1$. The position of the start of the short pattern $x^c$ is now known (to an accuracy of one sample). The synchronisation unit 20 refines the estimate of τ at step 36 by adding to $n_{est}$ the quantity Δτ calculated according to the relationship (4) given earlier, the standardisation factor λ of relationship (5) having been calculated once and for all and stored in unit 20.

Note that the possible residual frequency difference has no effect on the calculation of Δτ. This calculation leads to estimating the difference τ in seconds:

$$\tau = \frac{n_{est} + \Lambda\tau}{F_e}.$$

The refined estimate τ enables the performances of the Viterbi demodulator 21 to be optimised.

3) Fine Frequency Synchronisation

It is assumed in what follows that the synchronisation unit 20 of the receiver has previously acquired the time synchronisation on the transmitter at the resolution of the samples (the calculation of $n_{est}$ is therefore sufficient). The principle of fine frequency synchronisation according to the invention is to multiply the signal received point by point, by the conjugate of the expected signal, agreed between the transmitter and the receiver, which will have the effect of eliminating the modulation phase from the result. If, moreover, the modulation has a constant envelope, this result will be simply a (complex) sine wave embedded in the noise of the receiver. We can then estimate the frequency of this sine wave, which will be removed from the frequency of the oscillator 18 of the receiver, and/or used in digital processing, especially that of frequency correction.

This method also operates in the case of a modulation where the amplitude is not constant: instead of having a sine wave, we have an amplitude-modulated sine wave but there is still a line at the central frequency.

Hereafter we use the usual formalism of Hilbert spaces (here that of complex vectors of dimension N), and we will therefore use the inner product between 2 vectors $x=(x_0, x_1, \ldots, x_{n-1})^T$ and $y=(y_0, y_1, \ldots, y_{n-1})^T$:

$$\langle x, y \rangle = \sum_{n=0}^{N-1} x_n \cdot y_n^* \quad (13)$$

as well as the norm of a vector $x=(x_0, x_1, \ldots, x_{n-1})^T$:

$$\|x\| = \sqrt{\langle x, x \rangle} = \sqrt{\sum_{n=0}^{N-1} |x_n|^2} \quad (14)$$

The criterion from which the method described below will follow is that of maximum likelihood.

Let N be the number of samples for representing the signal, received. This number N may be equal to or less than the number N' samples of the reference segment. To implement the method, which uses a frequency transform such as a Fast Fourier Transform (FFT), N will preferably be a power of 2, or at least a value allowing a convenient FFT calculation. In the example considered, N=128 is suitable.

At this stage, the time synchronisation parameters have been obtained, so that the form of the expected signal is completely known. The propagation channel and the carrier offset remain unknown. $s=(s_0, s_1, \ldots, s_{n-1})^T$ designates the transmitted baseband signal (x) shifted by a frequency $\Delta f$. The probability density of the signal received, conditional upon the transmission of the signal x, is written:

$$p(r|x) = \frac{1}{(\pi \Sigma^2)^N} \exp\left(-\frac{1}{\Sigma^2} \sum_{n=0}^{N-1} |r_n - C \cdot x_n \cdot e^{2j\pi \cdot \Delta f \cdot n / F_e}|^2\right) \quad (15)$$

where $\Sigma^2$ is the power of noise b(t) in equation (6), assumed to be Gaussian. The likelihood will be maximal if the sum $\theta(\Delta f, C)$ in the exponential is minimal, i.e.:

$$\theta(\Delta f, C) = \sum_{n=0}^{N-1} |r_n - C \cdot x_n \cdot e^{2j\pi \cdot \Delta f \cdot n / F_e}|^2 \quad (16)$$

$$= \|r - C \cdot s\|^2$$

$$= \|r\|^2 + |C|^2 \cdot \|s\|^2 - 2 \cdot \text{Re}(C^* \cdot \langle r, s \rangle)$$

The solution to the problem is therefore the pair (C, $\Delta f$) which cancels out the differential of the function $\theta$. The derivative $$\frac{\partial \theta}{\partial C} = 2 \cdot C \cdot \|s\|^2 - 2 \cdot \langle r, s \rangle$$

is cancelled out for $$C = \frac{\langle r, s \rangle}{\|s\|^2}.$$

We thus obtain the simpler expression:

$$\theta = \|r\|^2 \cdot \frac{|\langle r, s \rangle|^2}{\|s\|^2}.$$

In the sequel, it will be assumed that the modulation used has a constant envelope (normalised to 1), and therefore the signal s too. Accordingly, the squared norm of s is equal to the number of samples N, and the expression of $\theta$ is further simplified: $\theta = \|r\|^2 - |\langle r, s \rangle|^2 / N$. Since only s depends on $\Delta f$, $\theta$ is minimal when $|\langle r, s \rangle|^2$ is maximal. The latter quantity can be interpreted when we expand the expression:

$$|\langle r, s \rangle|^2 = \left|\sum_{n=0}^{N-1} r_n \cdot s_n^*\right|^2 = \left|\sum_{n=0}^{N-1} (r_n \cdot x_n^*) e^{-2j\pi \cdot \Delta f \cdot n / F_e}\right|^2 \quad (17)$$

Therefore, it is the squared modulus of the discrete Fourier transform (DFT) of the signal r.x*, a signal which will subsequently be called y. Its Fourier transform is denoted as Y(f).

A strategy may then be devised for estimating $\Delta f$, based on a Fourier transform of the signal y. Step 37 of the fine estimation of $\Delta f$ therefore begins with the calculation of the vector y ($y_n = r_n \cdot x_n^*$ for $0 \leq n < N$), and with the calculation of its DFT by a standard complex FFT algorithm. Next, the unit 20 searches amongst the "natural" frequencies of this FFT, for that $f_{max}$ which maximises the squared modulus of this FFT. The FFT is defined in a number N of frequencies, or points, $f_i$ given by $$f_i = \frac{i \cdot F_e}{N}, \text{ for } 0 \leq i < N.$$

Of course, the search for the maximum $$\theta = \|r\|^2 - \frac{|\langle r, s \rangle|^2}{N}.$$

will not give the expected solution exactly, since there is no reason for $\Delta f$ to be precisely equal to one of the frequencies $f_i$ of the FFT. Next, the calculation will be refined. The principles on which this more accurate determination rests are, on the one hand, the fact that the Fourier transform of a truncated signal is equivalent to the Fourier transform of this same signal convoluted with a cardinal sine function, and on the other, a least squares type of approximation of a FFT by a cardinal sine function.

The modulus of a discrete Fourier transform $S_c(f)$ of a finite sequence of "1" of length N is a cardinal sine:

$$S_c(f) = \sum_{i=0}^{N-1} e^{-2j\pi \cdot f \cdot i / F_e} = \sum_{i=0}^{N-1} (e^{-2j\pi \cdot f / F_e})^i \quad (18)$$

$$= \frac{1 - \exp(-2j\pi N f / F_e)}{1 - \exp(-2j\pi f / F_e)}$$

$$= e^{-j\pi (N-1) f / F_e} \cdot \frac{\sin(\pi f N / F_e)}{\sin(\pi f / F_e)}$$

The discrete Fourier transform of a signal truncated to N samples is the convolution of the discrete Fourier transform of this signal untruncated by the function $S_c(f)$.

The aforementioned signal y is in principle a complex sine wave bearing a complex coefficient C characterising the propagation, plus the noise, namely: $y_n = C \cdot e^{2j\pi \cdot \Delta f \cdot N/F_e} + b_n$. Its discrete Fourier transform is then:

$$Y(f) = C \cdot S_c(f - \Delta f) + B(f) = \qquad (19)$$

$$C \cdot e^{-2j\pi(N-1)(f-\Delta f)/F_e} \cdot \frac{\sin(\pi N(f - \Delta f)/F_e)}{\sin(\pi(f - \Delta f)/F_e)} + B(f)$$

C and $\Delta f$ are then sought which make the best least square fit of Y(f) by a function $C.S_c(f-\Delta f)$, i.e. for which the cost $K(C,\Delta f) = \|Y(f)-C.S_c(f-\Delta f)\|^2$ is minimum. By a calculation similar to that presented earlier, we find that the solution for C is $$C = \frac{\langle Y(f), S_c(f - \Delta f)\rangle}{\|S_c(f - \Delta f)\|^2},$$

so that the cost function that $\Delta f$ must minimise is that given by the relationship (3).

In the expression of K and C, the calculations are done in the summable square functions space. Using the fact that the norm of $S_c$ is independent of $\delta f$, it is shown that the optimum value $\Delta f$ cancels out the function $F(\delta f)$ of relationship (1). Based on the signal received $r_n$, the unit 20 determines Y(f), sampled at the frequencies $f_i$. Moreover, it stores the values of $S_c(f-\delta f)$ and its derivative with respect to $\delta f$, sampled with the desired resolution for estimating $\Delta f$. The continuous inner products of formulae (1) and (3) are therefore naturally replaced by discrete inner products according to relationship (2), that is, for example:

$$\langle Y(f), S_c(f - \delta f)\rangle \cong \sum_{n=0}^{N-1} Y(f_i) \cdot S_c(f_i \cdot \delta f) \qquad (20)$$

The last step of the method is the search for $\Delta f$ which cancels out $F(\delta f)$, or the practically "findable" value which makes $F(\delta f)$ as close as possible to 0.

One possible technique is a dichotomic search on a predefined set of values of $\delta f$. It is shown that the cost function $K(\delta f)$ possesses, in addition to the absolute minimum in $\Delta f$, a series of local minima which differ from $\Delta f$ by multiples of $F_e/N$, which yield zeroes of function F. Care must be taken therefore not to converge towards one of these local minima. Accordingly, we note that the natural frequency $f_{max}$ for which $|Y(f)|^2$ is maximum gives an indication regarding the true value of $\Delta f$ with an error at most equal to $F_e/N$ (the frequency resolution of the FFT used). Consequently, if we search for $\Delta f$ around this first value, there is a risk of finding a value which differs by $\pm F_e/N$ with respect to the true value (this depends on the frequency resolution of the FFT and the location of $f_{max}$ with respect to $\Delta f$), but not beyond.

One solution may thus be to divide the interval $[f_{max}-F_e/N, f_{max}+F_e/N]$ into three sub-intervals $[f_{max}-F_0/N, f_{max}-F_e/3N]$, $[f_{max}-F_e/3N, f_{max}+F_e/3N]$ and $[f_{max}+F_e/3N, f_{max}+F_e/N]$, and to perform a dichotomic search in each of the sub-intervals. This ensures not missing the absolute minimum. Moreover, the convergence of the dichotomic method is guaranteed, for which there must be at the most a single passage through zero of the function F to be cancelled out. Among the three values found for $\Delta f$, the one that makes the cost K minimal is adopted. For methods other than dichotomy, which would tolerate the existence of several minima, the search could be done on the combination of the three preceding intervals.

This fine estimation of $\Delta f$ is carried out by the synchronisation unit 20 at step 37 in FIG. 4. If a digital frequency correction (multiplication of the unfiltered complex signal by $e^{-2j\pi\Delta f}$), is specified upstream of the filter 19, this can be effected on the current signal window in order to optimise the representativeness of the baseband signal $r_n$ (step 38 in FIG. 4). Otherwise (case illustrated in FIG. 3), the estimated value of $\Delta f$ is taken into account for the following windows by analog correction of the frequency of the oscillator 18, in order to correct the drifts of this frequency (or of that used by the transmitter).

At step 39, the unit 20 supplies the estimated time difference $\tau$ to the demodulator 21, in order to align on the time structure of the frames and symbols.

Finally, at step 40, the unit 20 supplies the estimated frequency difference $\Delta f$ to the control circuits of the oscillator 18, in order for them to correct the deviation from the frequency used by the transmitter.

It has been mentioned that correcting the frequency of the oscillator 18 could be optional when the reference segment has not been detected (test 32 or 35). This correction should not be applied systematically if there is no guarantee that the reference segment, when actually present, is entirely within a signal observation window (it may, for example, straddle two consecutive windows). The rough frequency correction may therefore be conditioned when test 32 or 35 is negative. One may, for example, choose to perform only this correction periodically, with a relatively low frequency in order to leave several packets of consecutive samples with the same frequency deviation. By choosing this period and the repetition period of the reference segment, expressed in numbers of frames, such that they are relatively prime integers, one guards against the pathological case where the frequency correction would systematically be applied right on the known signal segment.

Another solution would consist of only correcting the frequency of the oscillator if the current estimate of $\Delta f$ exceeded a specified threshold after the last correction application. This enables a rapid correction of a large initial deviation.

Simulations have been performed in the case of the numerical example given above as an illustration, taking into account three criteria:

the probability of non-detection of the reference segment (failure of the algorithm at test 32 or 35;

the probability of bad time synchronisation, by about 0.25 symbol time;

the probability of bad frequency synchronisation, by about 50 Hz.

Table I shows the results obtained under two simulation conditions:

A/ in the presence of noise without distortion due to the channel, for a signal-to-noise ratio of 5 dB;

B/ in the presence of noise and Rayleigh fading on the channel, for a signal-to noise ratio of 20 dB and a speed of 50 kilometres per hour.

TABLE I

| case | probability of non-detection | probability of bad time synchronisation | probability of bad frequency synchronisation |
|---|---|---|---|
| A | $10^{-3}$ | $2 \times 10^{-3}$ | $<10^{-3}$ |
| B | $1.2 \times 10^{-2}$ | $6 \times 10^{-3}$ | $7 \times 10^{-3}$ |

What is claimed is:

1. A method of synchronising a communication receiver, comprising the steps of evaluating a deviation between a modulation frequency, combined with a first baseband signal to form a signal transmitted on a propagation channel and a frequency used by the receiver to form a second baseband signal from a signal received on the propagation channel, and adjusting the frequency used by the receiver according to the evaluated deviation, wherein the step of evaluating said frequency deviation comprises, from a time segment of the first baseband signal and a time position of a corresponding segment of the second baseband signal, said segments comprising N samples at a sampling frequency $F_e$, N being a positive integer, calculating a frequency transform Y(f), of size N, of the product of the complex conjugate of said segment of the first baseband signal by the corresponding segment of the second baseband signal, and determining said frequency deviation Δf as being that for which the frequency transform Y(f) is the closest to $C.S_c(f-\Delta f)$, where $S_c(f)$ is the function $$S_c(f) = \frac{1-\exp(-2j\pi Nf/F_e)}{1\ \exp(2j\pi f/F_e)},$$

and C is a complex coefficient.

2. Method according to claim 1, wherein the step of evaluating said frequency deviation comprises:

determining a frequency $f_{max}$ which maximises the quantity $|Y(f)|^2$ among N points of the frequency transform;

dividing the interval $[f_{max}-F_e/N, f_{max}+F_e/N]$ into a plurality of sub-intervals;

a dichotomic search in each of the sub-intervals to identify each frequency δf which cancels out the quantity $$F(\delta f) = Re\left\{\langle Y(f), S_c(f\delta f)\rangle^* \cdot \left\langle Y(f) \cdot \frac{\partial S_c(f-\delta f)}{\partial(\delta f)}\right\rangle\right\}$$

where, for two complex functions of the frequency A(f) and B(f), <A(f),B(f−δf)> designates the inner product $$\langle A(f), B(f-\delta f)\rangle \cong \sum_{i=0}^{N-1} Y(f_i) \cdot B(f_i \cdot \delta f)^*,$$

$f_i$ designating the point of rank i of the frequency transform; and selecting the frequency deviation Δf as being that of the frequencies δf which cancels out the quantity F(δf) for which the cost function $$K(\delta f) = \left\|Y(f) - \frac{\langle Y(f), S_c(f-\delta f)\rangle \cdot S_c(f-\delta f)}{\|S_c(f-\delta f)\|^2}\right\|^2$$

is minimal, ||.|| being the norm associated with said inner product.

3. Method according to claim 1, wherein said time segment of the first baseband signal is known a priori by the receiver, the method including a time synchronisation phase for obtaining a time position of said segment of the second baseband signal.

4. Method according to claim 3, wherein said time segment of the first baseband signal includes several consecutive occurrences of a first sample pattern.

5. Method according to claim 4, wherein the time synchronisation phase includes a repetition test in which a normalised autocorrelation of the second baseband signal is evaluated with respect to a time difference corresponding to a difference between two occurrences of the first pattern in the time segment of the first baseband signal.

6. Method according to claim 4, wherein said time segment of the first baseband signal includes a second sample pattern, longer than the first pattern, in addition to the consecutive occurrences of the first pattern.

7. Method according to claim 6, wherein the time synchronisation phase includes a modulo $L_c$ estimation step by maximising a correlation between the second baseband signal and the consecutive occurrences of the first pattern, $L_c$ being the number of samples of the first pattern, and a modulo $L_c$ ambiguity removing step, supplying a time synchronisation at the resolution of the samples by maximising a correlation between the second baseband signal and the second pattern.

8. Method according to claim 7, further comprising the step of producing a quality estimate of the time synchronization on the basis of the maximised correlation between the second baseband signal and the second pattern.

9. Method according to claim 4, further comprising the step of carrying out a first time synchronisation producing a whole number $n_{est}$ representing a time difference, in number of samples, of the second baseband signal with respect to said time segment of the first baseband signal, and refining the first time synchronisation by adding to the whole number $n_{est}$ the quantity:

$$\Delta\tau - 1 - \lambda\frac{Re\left\{\sum_{q=0}^{N_c-1}\left[\left(\sum_{k=0}^{L_{Sc}-1} r_{n_{est}+q,L_c+k} \cdot x_k^{c*}\right) \cdot \left(\sum_{k=0}^{L_{Sc}-2} r_{n_{est}+q,L_c+k} \cdot dx_k^{c*}\right)\right]\right\}}{\sum_{q=0}^{N_c-1}\left\|\sum_{k=0}^{L_{Sc}-1} r_{n_{est}+q,L_c+k} \cdot x_k^{c*}\right\|^2},$$

where λ is the normalisation factor:

$$\lambda = \frac{\left(\sum_{k=0}^{L_{Sc}-1} |x_k^c|^2\right)^2}{\left(\sum_{k=0}^{L_{Sc}-1} |x_k^c|^2\right) \cdot \left(\sum_{k=0}^{L_{Sc}-1} |dx_k^c|^2\right) - \left[Im\left(\sum_{k=0}^{L_{Sc}-1} x_k^c \cdot dx_k^{c*}\right)\right]^2},$$

$N_c$ is the number of consecutive occurrences of the first pattern, $L_{Sc}$ is the number of samples of the repetitive sequence formed by the consecutive occurrences of the first pattern in said time segment of the first baseband signal, $r_{n_{est}}+q.L_{c+k}$ is the sample of rank $n_{est}+q.L_c+k$ of the second baseband signal, $x_k^c$ is the sample of rank k of said repetitive sequence, and $dx_k^c$ is the samples of rank k of a sequence formed by the time derivative of said repetitive sequence.

10. Method according to claim 1, further comprising an initial rough frequency synchronisation step based on the argument of an autocorrelation of the second baseband signal.

11. A synchronisation device for a communication receiver, comprising means for evaluating a deviation between a modulation frequency, combined with a first baseband signal to form a signal transmitted on a propagation channel and a frequency used by the receiver to form a second baseband signal from a signal received on the propagation channel, and means for adjusting the frequency used by the receiver according to the evaluated deviation, wherein the means for evaluating said frequency deviation comprise frequency transform calculation means for, from a time segment of the first baseband signal and a time position of a corresponding segment of the second baseband signal, said segments comprising N samples at a sampling frequency $F_e$, N being a positive integer, calculating a frequency transform Y(f), of size N, of the product of the complex conjugate of said segment of the first baseband signal by the corresponding segment of the second baseband signal, and means for determining said frequency deviation $\Delta f$ as being that for which the frequency transform Y(f) is the closest to $C.S_c(f-\Delta f)$, where $S_c(f)$ is the function $$S_c(f) = \frac{1 - \exp(-2j\pi N f / F_e)}{1 - \exp(-2j\pi f / F_e)},$$

and C is a complex coefficient.

12. A device according to claim 11, wherein the means for evaluating said frequency deviation comprises:

means for determining a frequency $f_{max}$ which maximises the quantity $|Y(f)|^2$ among N points of the frequency transform;

means for dividing the interval $[f_{max}-F_e/N, f_{max}+F_e/N]$ into a plurality of sub-intervals;

means for performing a dichotomic search in each of the sub-intervals to identify each frequency $\delta f$ which cancels out the quantity $$F(\delta f) = \mathrm{Re}\left\{\langle Y(f), S_c(f-\delta f)\rangle^* \left\langle Y(f), \frac{\partial S_c(f-\delta f)}{\partial (\delta f)}\right\rangle\right\}$$

where, for two complex functions of the frequency A(f) and B(f), <A(f),B(f-$\delta$f)> designates the inner product $$\langle A(f), B(f-\delta f)\rangle = \sum_{i=0}^{N-1} A(f_i) \cdot B(f_i - \delta f)^*,$$

$f_i$ designating the point of rank i of the frequency transform; and means for selecting the frequency deviation $\Delta f$ as being that of the frequencies $\delta f$ which cancels out the quantity F($\delta f$) for which the cost function $$K(\delta f) = \left\| Y(f) \frac{\langle Y(f), S_c(f-\delta f)\rangle \cdot S_c(f-\delta f)}{\|S_c(f-\delta f)\|^2}\right\|^2$$

is minimal, $\|.\|$ being the norm associated with said inner product.

13. A device according to claim 11, wherein said time segment of the first baseband signal is known a priori by the receiver, the device further comprising time synchronisation means for obtaining a time position of said segment of the second baseband signal.

14. A device according to claim 13, wherein said time segment of the first baseband signal includes several consecutive occurrences of a first sample pattern.

15. A device according to claim 14, wherein the time synchronisation means include means for carrying out a repetition test in which a normalised autocorrelation of the second baseband signal is evaluated with respect to a time difference corresponding to a difference between two occurrences of the first pattern in the time segment of the first baseband signal.

16. A device according to claim 14, wherein said time segment of the first baseband signal includes a second sample pattern, longer than the first pattern, in addition to the consecutive occurrences of the first pattern.

17. A device according to claim 16, wherein the time synchronisation means include means for calculating a modulo $L_c$ estimation by maximising a correlation between the second baseband signal and the consecutive occurrences of the first pattern, $L_c$ being the number of samples of the first pattern, and means for removing modulo $L_c$ ambiguity, supplying a time synchronisation at the resolution of the samples by maximising a correlation between the second baseband signal and the second pattern.

18. A device according to claim 17, further comprising means for producing a quality estimate of the time synchronization on the basis of the maximised correlation between the second baseband signal and the second pattern.

19. A device according to claim 14, further comprising means for carrying out a first time synchronisation producing a whole number $n_{est}$ representing a time difference, in number of samples, of the second baseband signal with respect to said time segment of the first baseband signal, and means for refining the first time synchronisation by adding to the whole number $n_{est}$ the quantity:

$$\Delta\tau - 1 - \lambda \frac{\mathrm{Re}\left\{\sum_{q=0}^{N_c-1}\left[\left(\sum_{k=0}^{L_{Sc}-1} r_{n_{est}+q.L_c+k} \cdot x_k^{c*}\right) \cdot \left(\sum_{k=0}^{L_{Sc}-2} r_{n_{est}+q.L_c+k} \cdot dx_k^{c*}\right)\right]\right\}}{\sum_{q=0}^{N_c-1}\left\|\sum_{k=0}^{L_{Sc}-1} r_{n_{est}+q.L_c+k} \cdot x_k^{c*}\right\|^2},$$

where $\lambda$ is the normalisation factor:

$$\lambda = \frac{\left(\sum_{k=0}^{L_{Sc}-1} |x_k^c|^2\right)^2}{\left(\sum_{k=0}^{L_{Sc}-1} |x_k^c|^2\right) \cdot \left(\sum_{k=0}^{L_{Sc}-1} |dx_k^c|^2\right) - \left[\mathrm{Im}\left(\sum_{k=0}^{L_{Sc}-1} x_k^c \cdot dx_k^{c*}\right)\right]^2},$$

$N_c$ is the number of consecutive occurrences of the first pattern, $L_{Sc}$ is the number of samples of the repetitive sequence formed by the consecutive occurrences of the first pattern in said time segment of the first baseband signal, $r_{n_{est}+q.L_{c+k}}$ is the sample of rank $n_{est}+q.L_c+k$ of the second baseband signal, $x_k^c$ is the sample of rank k of said repetitive sequence, and $dx_k^c$ is the sample of rank k of a sequence formed by the time derivative of said repetitive sequence.

20. A device according to claim 11, further comprising means for performing an initial rough frequency synchronisation based on the argument of an autocorrelation of the second baseband signal.

* * * * *